(12) United States Patent
Smith

(10) Patent No.: US 10,879,855 B1
(45) Date of Patent: Dec. 29, 2020

(54) CONFIGURABLE DUAL VACUUM TUBE TRIODE AMPLIFIER

(71) Applicant: MESA/Boogie Ltd., Petaluma, CA (US)

(72) Inventor: Randall Smith, Petaluma, CA (US)

(73) Assignee: MESA/Boogie Ltd, Petaluma, CA (US)

( * ) Notice: Subject to any disclaimer, the term of this patent is extended or adjusted under 35 U.S.C. 154(b) by 0 days.

(21) Appl. No.: 16/785,168

(22) Filed: Feb. 7, 2020

(51) Int. Cl.
*H03G 3/00* (2006.01)
*H03F 1/32* (2006.01)
*H03F 3/181* (2006.01)
*G10H 3/18* (2006.01)

(52) U.S. Cl.
CPC ............ *H03F 1/327* (2013.01); *G10H 3/187* (2013.01); *H03F 1/3276* (2013.01); *H03F 3/181* (2013.01); *H03F 2200/03* (2013.01); *H03F 2200/549* (2013.01)

(58) Field of Classification Search
CPC ....................................................... H03G 3/00
See application file for complete search history.

(56) References Cited

U.S. PATENT DOCUMENTS

| 4,644,289 | A | * | 2/1987 | Kennedy | H03G 3/22 330/118 |
| 4,701,957 | A | * | 10/1987 | Smith | G10H 1/16 330/149 |
| 9,917,560 | B1 | * | 3/2018 | Smith | H03F 1/0277 |
| 2006/0050900 | A1 | * | 3/2006 | Smith | H03F 3/68 381/118 |
| 2015/0049883 | A1 | * | 2/2015 | Ibrahim | H03F 3/72 381/118 |

* cited by examiner

*Primary Examiner* — Olisa Anwah
(74) *Attorney, Agent, or Firm* — Schwegman Lundberg & Woessner, P.A.

(57) ABSTRACT

Disclosed is a configurable dual vacuum tube triode amplifier. The amplifier comprises two vacuum tube triodes and a user configurable switching component. The user configurable switching component can be positioned into at least a first position and a second position to modify an arrangement of the two vacuum tube triodes to provide varying tonal characteristics of the amplifier. Positioning the user configurable switching component in the first position arranges the two vacuum tube triodes in a cascode configuration to achieve a tonal characteristic of a vacuum tube pentode. Positioning the multi-position user switch in the second position arranges the two vacuum tube triodes in either a single vacuum tube triode configuration to achieve a tonal characteristic of a single vacuum tube triode operating alone or two vacuum tube triodes operating in a parallel configuration to achieve the tonal characteristics of two vacuum tube triodes operating in parallel.

20 Claims, 6 Drawing Sheets

FIG. 4

CONFIGURABLE DUAL VACUUM TUBE TRIODE AMPLIFIER

TECHNICAL FIELD

The present disclosure generally relates to the technical field of vacuum tube amplifiers. In particular, the present disclosure relates to a configurable dual vacuum tube triode amplifier.

BACKGROUND

In the field of electric guitar amplification, history plays an important role. For many players, the ability to reproduce guitar tones made iconic by bands such as the Beatles remains a high priority. This is true not just for "cover" or "tribute" bands, but for a sizable segment of musicians. The guitar sounds produced by now-old amplifiers are definitive and classic and the desire to achieve these tones persists today.

One example of these classic amplifiers is the British made VOX amplifiers of the 1960s popularized by the Beatles, The Rolling Stones, Queen and many others. The best of these amplifiers were two-channel amplifiers where one of the channels utilized an EF-86 pentode vacuum tube input amplifier while the other channel used the common 12AX7 triode vacuum tube as its input amplifier. The two channels had significantly different audio characteristics, which was primarily due to the higher-gain characteristics of the EF-86 pentode vacuum tube.

Selection of the channels was accomplished simply by choosing which input jack the guitar accessed and, unlike many of today's amplifiers, the channels were not able to be preset and foot switch selected in order to readily access the different sounds provided by each channel (e.g, a cleaner sound using the 12AX7 triode vacuum tube and one more capable of being overdriven via the higher-gain EF-86 pentode vacuum tube).

Even when vacuum tubes were mainstream components, the EF-86 pentode vacuum tube (a.k.a. 6267) was notoriously noisy and unreliable. Presently the EF-86 pentode vacuum tube is also rare and expensive, as are the vintage amplifiers that used them. Accordingly, there is a need to provide the desirable gain characteristics of the EF-86 pentode vacuum tube, while overcoming its associated problems of noise, failure and expense.

BRIEF DESCRIPTION OF THE DRAWINGS

Various ones of the appended drawings merely illustrate example embodiments of the present disclosure and are not intended to limit its scope to the illustrated embodiments. On the contrary, these examples are intended to cover alternatives, modifications, and equivalents as may be included within the scope of the disclosure.

FIG. 4 is a circuit diagram of a configurable amplifier input channel using two vacuum tube triodes, according to some example embodiments.

DETAILED DESCRIPTION

Figure 1:
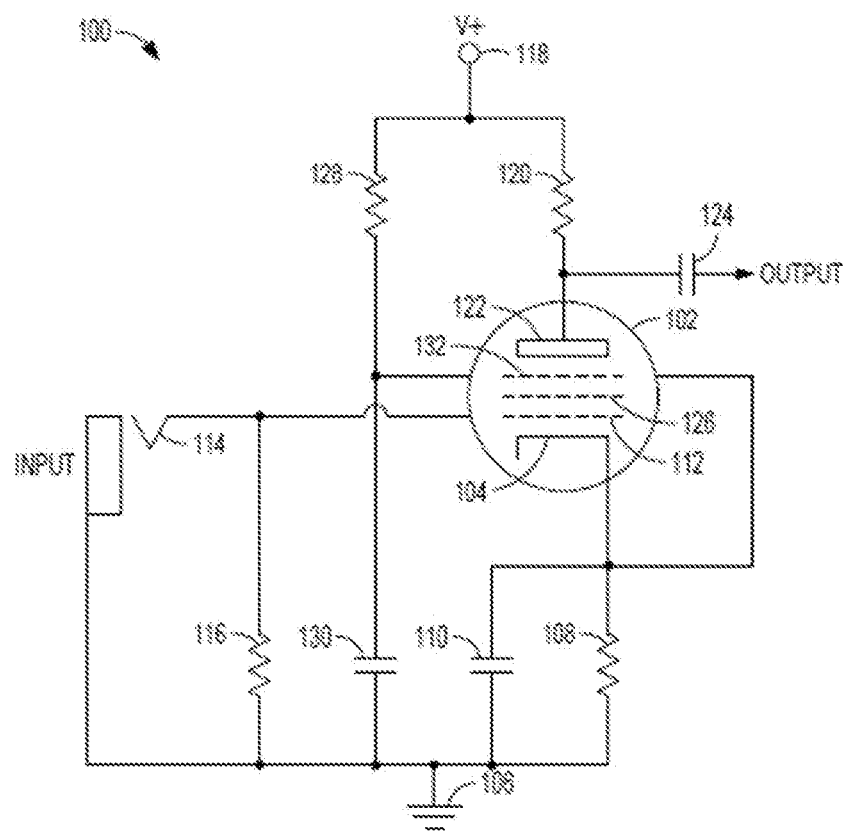
FIG. 1 is a circuit diagram of an amplifier input channel using a vacuum tube pentode configuration.

Reference will now be made in detail to specific example embodiments for carrying out the inventive subject matter of the present disclosure. In the following description, specific details are set forth in order to provide a thorough understanding of the subject matter. It shall be appreciated that embodiments may be practiced without some or all of these specific details.

Disclosed is a configurable dual vacuum tube triode amplifier that provides for varying tonal characteristics. An input channel of the amplifier (e.g., amplifier preamp) utilizes two vacuum tube triodes residing within either a single dual triode vacuum tube, such as the 12AX7, or within separate vacuum tubes, such as two single triode vacuum tubes or two dual triode vacuum tubes, to provide desired tonal characteristics for the amplifier. The amplifier allows for the arrangement of the two vacuum tube triodes to be modified to achieve varying tonal characteristics, such as by providing for varying gain levels. For example, the amplifier may provide for one arrangement of the two vacuum tube triodes to provide the higher gain and resulting tonal characteristics of a vacuum tube pentode configuration, which is typically provided by a pentode vacuum tube such as the EF-86. The amplifier may also provide another arrangement of the vacuum tube triodes to provide the lower gain and resulting tonal characteristics of two vacuum tube triodes operating in a parallel configuration or a single vacuum tube triode configuration.

To achieve tonal characteristics nearly identical to the tonal characteristics provided by a vacuum tube pentode configuration, the two vacuum tube triodes are arranged in a cascode configuration. In a cascode configuration, the plate element of one vacuum tube triode is connected to the cathode of the other vacuum tube triode. Accordingly, the signal voltage of one vacuum tube triode modulates the current flowing to the other vacuum tube triode, which may provide an increase in gain, similar to the increase in gain provided by a vacuum tube pentode configuration. The cascode configuration is little known and rarely used in the field of electronics as a whole, and it has not been used in the commercial field of instrument amplification to increase the gain provided by triode vacuum tubes, as described in the present disclosure. The increase in gain provided by configuring vacuum tube triodes in a cascode configuration achieves the desired tonal characteristics of a pentode configuration.

The varying arrangements of the two vacuum tube triodes may be accomplished using electronic switches implemented within the input channel circuit of the amplifier. The electronic switches may be any type of electronic switch that is capable of coupling and decoupling electronic components within a circuit. For example, the electronic switch may be an electronic component configured to disconnect or connect a conducting path in an electronic circuit to interrupt or divert the electrical current from one conductor to another. As another example, the varying arrangements of the two vacuum tube triodes may be accomplished via two separately wired input channel circuits, which may each be accessed separated using different input jacks.

The amplifier additionally includes a user configurable switching component that can be positioned in various positions to modify the arrangement of the two vacuum tube triodes in the input channel circuit of the amplifier. For example, the user configurable switching component may be a foot switch, knob, toggle switch, or the like. As another example, the user configurable switching component may be two separate input jacks to which an instrument cable may be connected.

A user may position the user configurable switching component into a desired position to modify the arrangement of the vacuum tube triodes, thereby changing the tonal characteristics provided by the amplifier. For example, the user may modify the position of the user configurable switching component to cause a change in state of the electronic switches implemented within the input channel circuit of the amplifier, thereby causing a change to the arrangement of the vacuum tube triodes. For example, the user configurable switching component may be positioned in a first position to arrange the vacuum tube triodes in a cascode configuration providing tonal characteristics of a vacuum tube pentode configuration. The user configurable switching component may also be positioned in a second position to arrange the vacuum tube triodes in a single vacuum tube triode configuration or as two vacuum tube triodes operating in a parallel configuration to achieve the corresponding tonal characteristics.

This configurable design allows for commonly available, quiet, and reliable triode vacuum tubes, such as the 12AX7, to be used in place of pentode vacuum tubes to achieve the tonal characteristics provided by a vacuum tube pentode configuration, thereby addressing the shortcoming of previous amplifiers that used the rare and problematic EF-86 vacuum tube, such as the historic VOX amps. That is, the amplifier uses vacuum tube triodes arranged in a cascode configuration in place of a pentode vacuum tube to achieve a nearly identical tonal characteristic, while also providing for easy switching between separate tonal characteristics using a user configurable switching component (e.g., foot switch). These provided benefits are of paramount importance for amplifier manufacturers by offering economy, reliability, versatility and availability while accurately delivering the desired musical characteristics of vintage amplifiers.

FIG. 1 is a circuit diagram of an amplifier input channel 100 using a vacuum tube pentode configuration. As shown in FIG. 1, the amplifier input channel 100 includes a vacuum tube pentode 102, as found in a pentode vacuum tube such as the EF-86. The vacuum tube pentode 102 includes a cathode element 104 connected to ground 106 through a biasing resistor 108 and a bypass capacitor 110. A control grid 112 receives incoming instrument (e.g., guitar) signal voltage via an input jack 114 and includes a grid leak resistor 116 to maintain a zero-direct current (DC) voltage on the control grid 112.

High DC voltage at a terminal 118 feeds a load resistor 120 connected to the plate element 122 of the vacuum tube pentode 102, and the fluctuations in DC voltage across load resistor 120 comprise the amplified signal. A coupling capacitor 124 blocks high DC voltage and allows only the amplified signal to proceed as output.

The vacuum tube pentode 102 includes a screen grid element 126 that receives a high DC voltage from the terminal 118 through a resistor 128 and is bypassed to a ground 106 through a capacitor 130. A suppressor grid 132 connects to the cathode element 104 in customary fashion. The vacuum tube pentode 102 offers a significantly higher amplifying factor, or gain, than provided by a vacuum tube triode and that extra gain is the defining tonal characteristic of the amplifier input channel 100 using the vacuum tube pentode 102.

Figure 2:
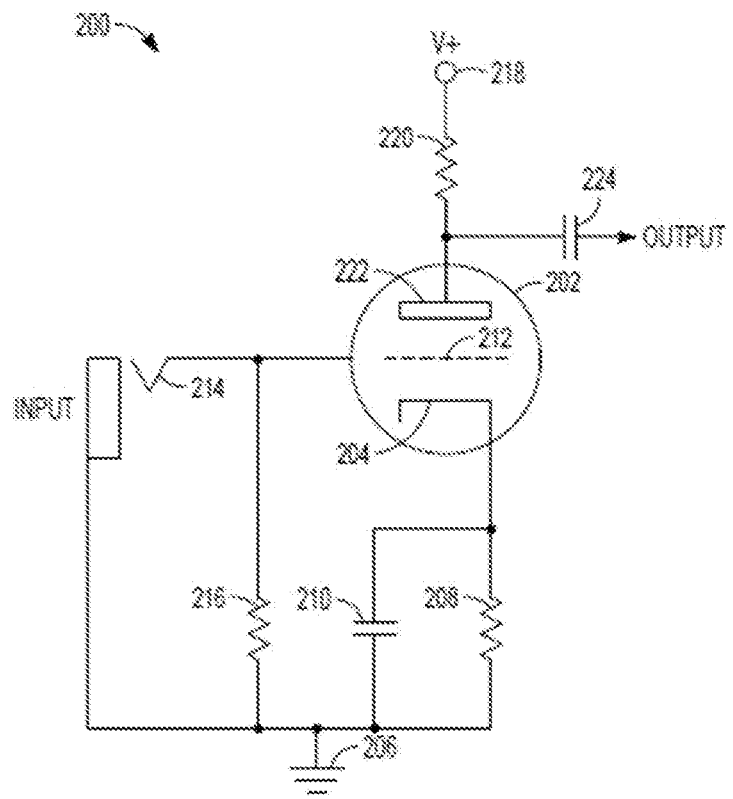
FIG. 2 is a circuit diagram of an amplifier input channel using a single vacuum tube triode configuration.

FIG. 2 is a circuit diagram of an amplifier input channel 200 using a single vacuum tube triode 202, such as may be found in a single triode vacuum tube or a dual triode vacuum tube (e.g., 12AX7). The vacuum tube triode 202 includes a cathode element 204 that is connected to ground 206 via a resistor 208. A bypass capacitor 210 increases the gain and determines the low frequency roll off curve. A control grid 212 of the vacuum tube triode 202 receives signal from an electric instrument through an input terminal 214. a grid leak resistor 216 maintains zero DC voltage at control grid 212, thereby preventing static charging of the control grid 212.

High DC voltage at a terminal 218 is fed through a load resistor 220 to the triode plate element 222 of the vacuum tube triode 202, and the fluctuations in DC voltage across the load resistor 220 comprise the amplified signal. A coupling capacitor 224 blocks high DC voltage and allows only the signal voltage fluctuations to pass through to the output.

Figure 3:
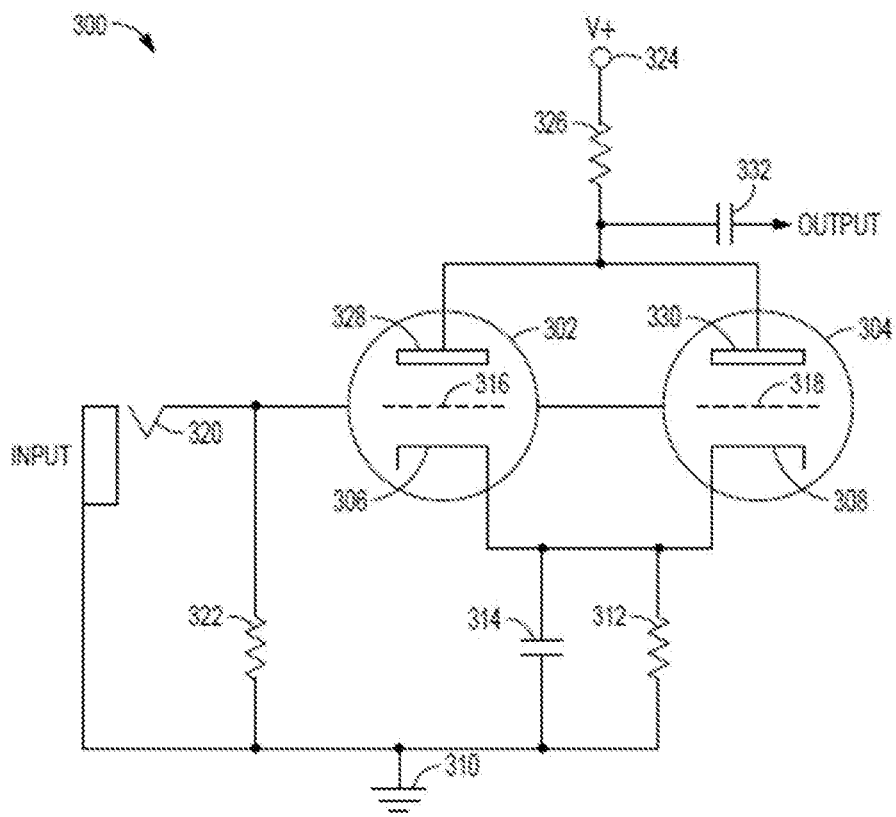
FIG. 3 is a circuit diagram of an amplifier input channel using two vacuum tube triodes operating in a parallel configuration.

FIG. 3 is a circuit diagram of an amplifier input channel 300 using multiple vacuum tube triodes 302, 304, such as (e.g., vacuum tube triode 302 and vacuum tube triode 304) operating in a parallel. The vacuum tube triodes 302, 304 may be encompassed within a single dual triode vacuum tube, such as a 12AX7, or within two separate vacuum tubes, such as two single triode vacuum tubes or two dual triode vacuum tubes. FIG. 3 represents a similar circuit as shown in FIG. 2, but with two vacuum tube triodes 302, 304 operating in parallel, rather than a single vacuum tube triode 202 operating alone, as shown in FIG. 2. This may provide a sonic improvement and/or lower noise compared to an amplifier input channel 200 that utilizes a single vacuum tube triode 202 performing the same function. There is, however, no appreciable increase in gain between the amplifier input channel 300 shown in FIG. 3 and the amplifier input channel 200 shown in FIG. 2.

Although some component values may be altered to accommodate the increase in current due to two vacuum tube triodes 302, 304 operating in parallel, the circuit is otherwise identical to that of FIG. 2. As shown in FIG. 3 the cathodes 306, 308 of the vacuum tube triodes 302, 304 are connected together and biased and coupled to ground 310 through a resistor 312 and bypass capacitor 314. The control grids 316, 318 of the vacuum tube triodes 302, 304 are connected together and receive signal from an input terminal 320. A grid leak resistor 322 is provided to remove static charges from the control grids 316, 318 in standard fashion.

High DC voltage at a terminal 324 is fed through load resistor 326 to the plate elements 328, 330 of the two vacuum tube triodes 302, 304. A coupling capacitor 332 blocks high DC voltage and conducts the signal voltage to the output.

Figure 4:
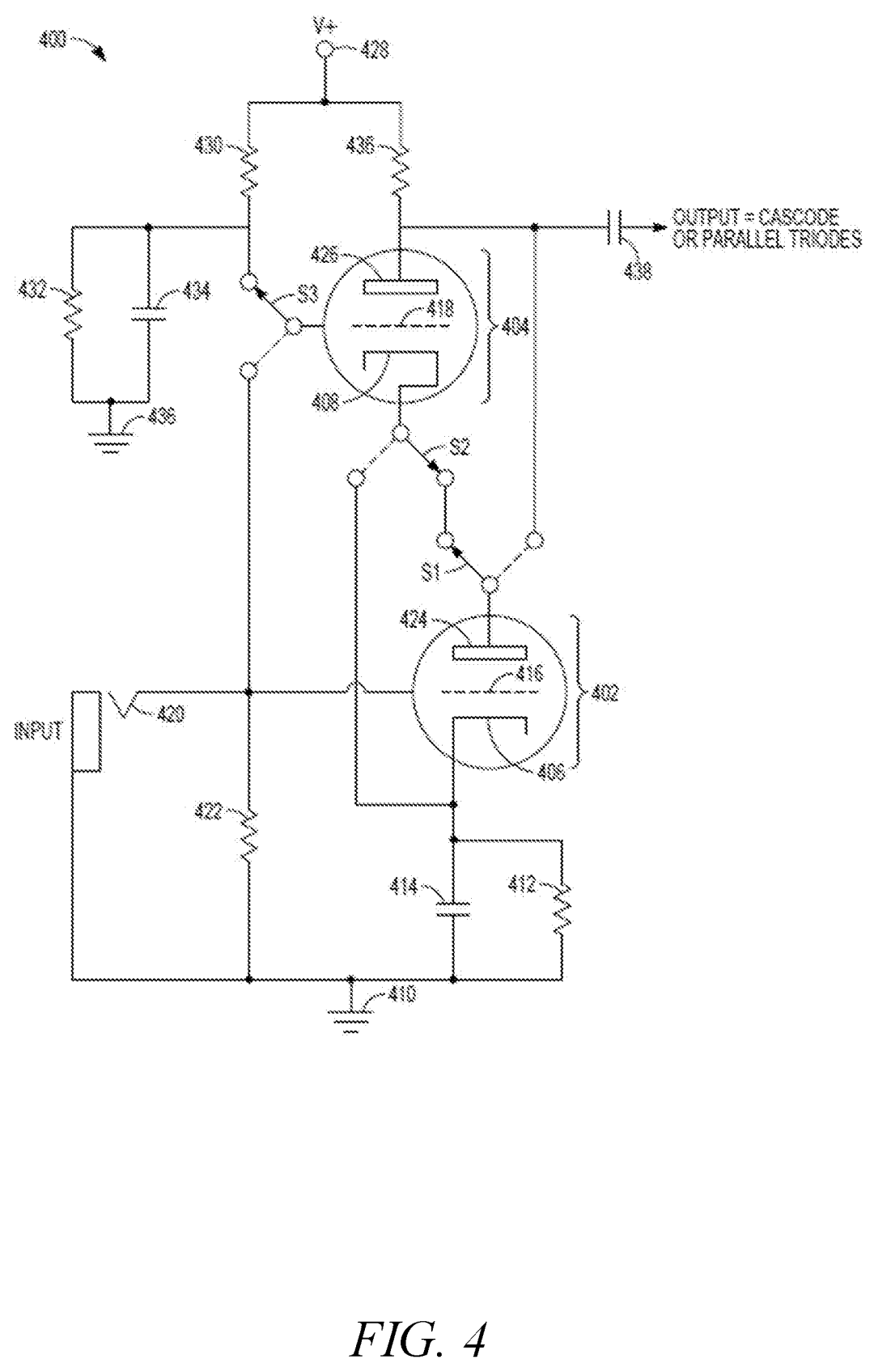

FIG. 4 is a circuit diagram of a configurable amplifier input channel 400 using two vacuum tube triodes 402, 404, according to some example embodiments. The vacuum tube triodes 402, 404 may be encompassed within a single dual triode vacuum tube, such as a 12AX7, or within two separate vacuum tubes, such as two single triode vacuum tubes or two dual triode vacuum tubes.

As shown in FIG. 4, the configurable amplifier input channel 400 allows for an arrangement of the two vacuum tube triodes 402, 404 to be modified to provide varying tonal characteristics of an amplifier. For example, the two vacuum tube triodes 402, 404 can be arranged in a cascode configuration, as shown by the arrows in the switching devices S1, S2, S3, to achieve a tonal characteristic that is nearly identical to the amplifier input channel 100 shown in FIG. 1 that uses a single vacuum tube pentode 102. Alternately, the two vacuum tube triodes 402, 404 can be arranged in a parallel configuration, as shown by the dashed lines at the switching devices S1, S2, S3, to achieve the tonal characteristics of the amplifier input channel 300 shown in FIG. 2 that uses two vacuum tube triodes 302, 304 operating in a parallel configuration.

The configurable amplifier input channel 400 includes electronic switches S1, S2, S3 that allow for the varying arrangement of the two vacuum tube triodes 402, 404. For example, a state of the electronic switches S1, S2, S3 may be set into a first state as shown by the arrows in the electronic switches S1, S2, S3 in which the two vacuum tube triodes 402, 404 are arranged in a cascode configuration. Alternatively, the state of the electronic switches S1, S2, S3 may be set in a second state as shown by the dashed in the electronic switches S1, S2, S3, in which the two vacuum tube triodes 402, 404 are arranged in a parallel configuration.

The state of the electronic switches may be modified using a user configurable switching component, such as a footswitch, that can be positioned into multiple positions. For example, the user configurable switching component may be positioned into a first position to cause the first state of the electronic switches as shown by the arrows in the switching devices S1, S2, S3, thereby causing the two vacuum tube triodes 402, 404 to be arranged in a cascode configuration. Alternatively, the user configurable switching component may be configured into a second position to cause the second state of the electronic switches as shown by the dashed lines in the switching devices S1, S2, S3, thereby causing the two vacuum tube triodes 402, 404 to be arranged in a parallel configuration. Accordingly, a user of an amplifier that includes the configurable amplifier input channel 400 may use the user configurable switching component to easily change the arrangement of the two vacuum tube triodes 402, 404 to cause a corresponding change in the tonal characteristics of the amplifier.

As shown in FIG. 4, a cathode element 406 of the input vacuum tube triode 402 is biased and connected to a ground 410 by a resistor 412. A cathode bypass capacitor 414 performs the usual duties of increasing gain and tailoring the frequency response. The control grid 416 of the input vacuum tube triode 402 receives signal voltage from the input terminal 420 and uses a grid leak resistor 422 to maintain a zero DC voltage at the control grid 416. The portions of the configurable amplifier input channel 400 discussed in this paragraph are similar to the amplifier input channel 200 shown in FIG. 2.

In contrast to the amplifier input channel 200 shown in FIG. 2, however, the plate element 424 of the input vacuum tube triode 402 is connected via the electronic switches S1, S2 to a cathode 408 of the upper vacuum tube triode 404 where the signal voltage provided by the input vacuum tube triode 402 modulates the current flowing through the upper vacuum tube triode 404. Modulating the current flowing through the upper vacuum tube triode 404 in this manner can be used to provide an increase in gain.

To achieve this, the control grid 418 of the upper vacuum tube triode 404 is biased from high DC voltage at terminal 428 through a voltage divider comprising a series resistor 430 and a shunt resistor 432. The control grid 418 of the upper vacuum tube triode 404 is bypassed for AC signals by a capacitor 434 to ground 436. The plate element 426 of the upper vacuum tube triode vacuum tube 404 receives high DC voltage from the terminal 428 and voltage amplification occurs across a plate load resistor 436 in the usual fashion. A DC blocking capacitor 438 couples amplified signal to provide an output of the two vacuum tube triodes 402, 404 arranged in the cascode configuration.

Alternately, when the electronic switches S1, S2, S3 are in a state as shown by dashed lines in FIG. 4, the two vacuum tube triodes 402, 404 are arranged in a parallel configuration, similar to the amplifier input channel 300 as shown in FIG. 3. In this state, a first electronic switch S1 connects the plate element 424 of the input vacuum tube triode 402 to the plate element 426 of the upper vacuum tube triode 404, a second electronic switch S2 connects the cathode element 406 of the input vacuum tube triode 402 to the cathode 408 of the upper vacuum tube triode 404, and a third electronic switch S3 connects together the control grid 416 of the input vacuum tube triode 402 to the control grid 418 of the upper vacuum tube triode 404, and isolates the control grid 418 of the upper vacuum tube triode 404 from the bypass capacitor 434 and the voltage divider 430, 432 fed by the high voltage terminal 428.

Figure 5:
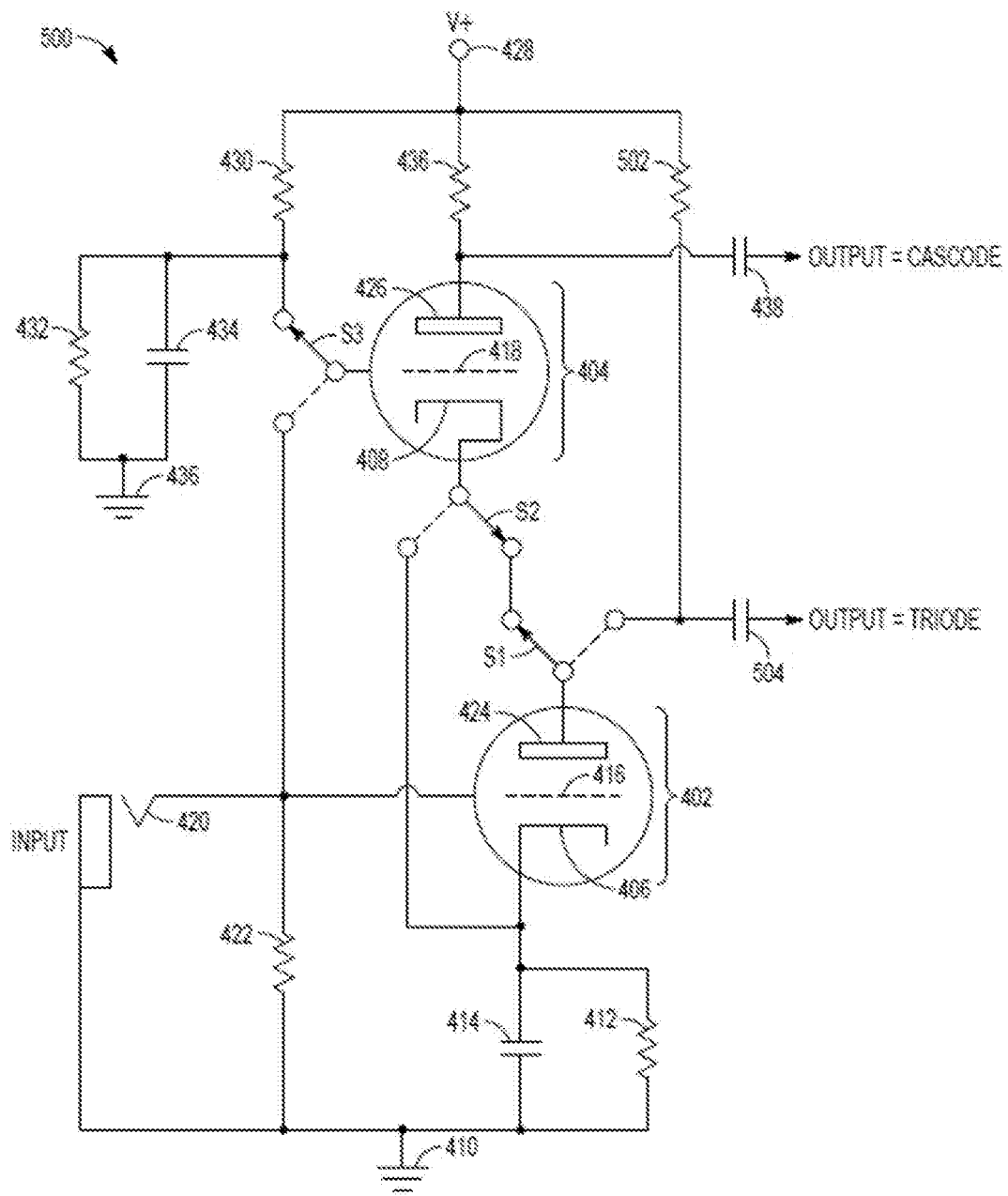
FIG. 5 is a circuit diagram of a configurable amplifier input channel using two vacuum tube triodes, according to some example embodiments.

FIG. 5 is a circuit diagram of a configurable amplifier input channel 500 using two vacuum tube triode vacuum tubes 402, 404, according to some example embodiments. As the circuit shown in FIG. 5 is nearly identical to the circuit shown in FIG. 4, the discussion of FIG. 5 will focus primarily on the differences between the two circuits.

The configurable amplifier input channel 500 shown in FIG. 5 allows for an arrangement of the two vacuum tube triodes 402, 404 to be modified to achieve varying tonal characteristics. Similar to the configurable amplifier input channel 400 shown in FIG. 4, the two vacuum tube triodes 402, 404 shown in FIG. 5 can be arranged in a cascode configuration, when the electronic switches S1, S2, S3 are in a first state as represented by arrows in the electronic switches S1, S2, S3. When arranged in the cascode configuration, the configurable amplifier input channel 500 achieves a tonal characteristic that is nearly identical to the amplifier input channel 100 shown in FIG. 1 that uses a single vacuum tube pentode 102.

In contrast to the configurable amplifier input channel 400 shown in FIG. 4, the two vacuum tube triodes 402, 404 shown in FIG. 5 can also be arranged in a single vacuum tube triode configuration, when the electronic switches S1, S2, S3 are in a second state as represented by the dashed lines at the electronic switches S1, S2, S3. When arranged in the single vacuum tube triode configuration, the configurable amplifier input channel 500 achieves the tonal characteristic of the amplifier input channel 200 shown in FIG. 2 that uses a single vacuum tube triode 202 operating alone.

As with the configurable amplifier input channel 400 shown in FIG. 4, the arrangement of the two vacuum tube triodes 402, 404 may be modified using a user configurable switching component, such as a footswitch, that can be positioned into multiple positions. For example, the user configurable switching component can be positioned into a first position to cause the electronic switches S1, S2, S3 to be in the state shown by the arrows, thereby arranging the two vacuum tube triodes 402, 404 in a cascode configuration. Alternatively, the user configurable switching component can be positioned into a second position to cause the electronic switches S1, S2, S3 to be in the state as shown by the dashed lines, thereby arranging the two vacuum tube triodes 402, 404 in a single vacuum tube triode configuration, similar to the amplifier input channel 200 as shown in FIG. 2.

The electronic switches S1, S2, S3 being in the state as shown by the dashed lines, connects the plate element 424 of the input vacuum tube triode 402 to the terminal 428 through a load resistor 502 such that input vacuum tube triode 402 operates as a single-vacuum tube triode amplifier (like that of FIG. 2) and has its output coupled through blocking capacitor 504. The upper vacuum tube triode 404 is then unused and available for a separate application. That is, the upper vacuum tube triode 404 is not used within the circuit shown in FIG. 5 in which the input vacuum tube triode 402 remains in use. However, the upper vacuum tube triode 404, when unused within the circuit shown in FIG. 5 may be used for another purpose. That is, the upper vacuum tube triode 404 may be included in another circuit (not shown) within the amplifier. In this type of embodiment, the upper vacuum tube triode 404 and the input vacuum tube triode 402 would be used in different circuits such that the input vacuum tube triode 402 would be used and the upper vacuum tube triode 404 would not be used within the circuit shown in FIG. 5, while the upper vacuum tube triode 404 would be used and the input vacuum tube triode 402 would not be used within the other circuit.

The ability to modify the arrangement of the two vacuum tube triodes 402, 404, as shown by the varying states of the electronic switches S1, S2, S3 in FIGS. 4 and 5, allows for the arrangement of the two vacuum tube triodes 402, 404 to be easily modified using a user configurable switching component, such as a foot switch. This provides a modern benefit to a legacy amplifier's performance. Further benefits of economy, reliability and noise reduction are also achieved while utilizing commonly available triode vacuum tubes, such as the 12AX7. While FIG. 4 and FIG. 5 show two embodiments of the present invention, these are not meant to be limiting. Minor deviations to the shown embodiments may circumvent some specifics, while providing the equivalent of its essence.

Figure 6:
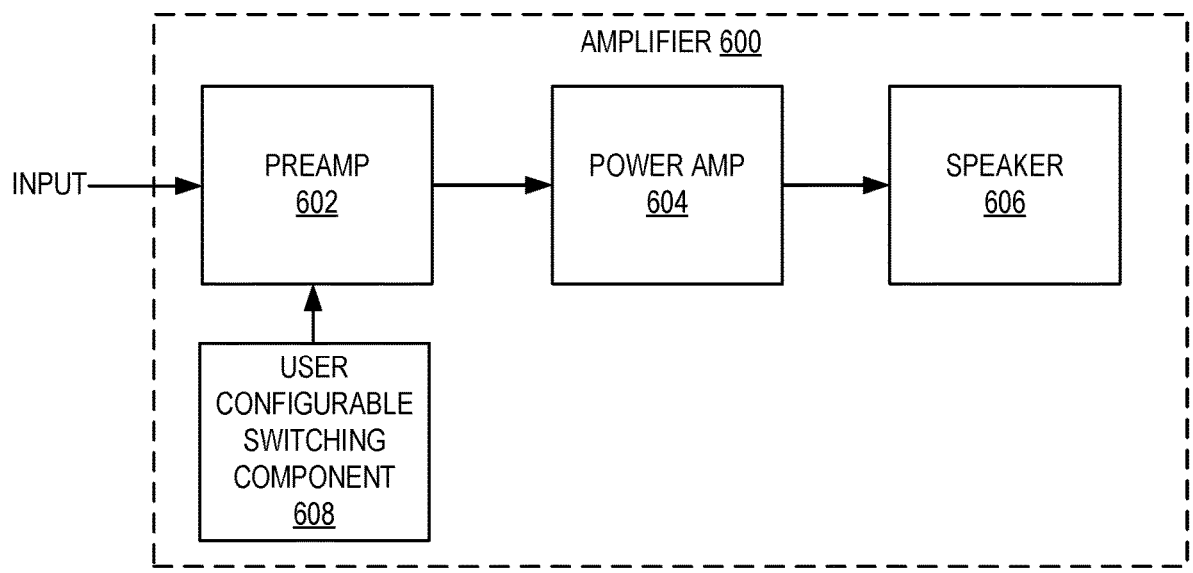
FIG. 6 is a block diagram of an amplifier including a configurable amplifier input channel, according to some example embodiments

FIG. 6 is a block diagram of an amplifier 600 including a configurable amplifier input channel (e.g., shown in FIGS. 4 and 5), according to some example embodiments. As shown, the amplifier 600 includes a preamp 602, a power amp 604, a speaker 606, and a user configurable switching component 608. The preamp 602 receives an input signal from an electronic instrument, that is connected to the amplifier 600. For example, the input signal may be received from an electric guitar connected to the amplifier 600 via an instrument cable.

The preamp includes two vacuum tube triodes 402, 404, which can be arranged into a cascode configuration or a normal vacuum tube triode configuration, such as two vacuum tube triodes 402, 404 operating in a parallel configuration (as shown in FIG. 4) or a single vacuum tube triode configuration (as shown in FIG. 5).

The user configurable switching component 608 is connected to the preamp and can be used to modify the arrangement of the two vacuum tube triodes 402, 404. For example, the user configurable switching component 608 may be positioned into a first position to cause the two vacuum tube triodes 402, 404 to be arranged in a cascode configuration, and the user configurable switching component 608 may be positioned into a second position to cause the two vacuum tube triode vacuum tubes 402, 404 to be arranged in either a parallel configuration or a single vacuum tube triode vacuum tube configuration. The user configurable switching component 608 may be any type of component capable of being configured into multiple positions, such as a foot switch, knob, toggle switch, multiple input jacks, or the like.

The preamp 602 pass the input signal through the arrangement of the two vacuum tube triodes 402, 404 to generate an output signal. The preamp 602 provides the output signal to the power amp 604, which amplifies the output signal to result in an amplified output signal. The power amp 604 then provides the amplified output signal to the speaker 606, which outputs audio sound based on the amplified output signal generated by the power amp 606.

Although the amplifier 600 shown in FIG. 6 includes a preamp 602, power amp 604 and a speaker 606, this is just one embodiment and is not meant to be limiting. In some embodiments, the amplifier 600 may not include either the power amp 604 and/or the speaker 606. Further, the amplifier 600 may include any number of speakers 606. Finally, the preamp 602, power amp 604, and speaker 606 may be encompassed within a single physical component, such as a combo amplifier, or alternatively, encompassed within multiple physical components, such as a separate amplifier head and amplifier speaker cabinet.

Language

Although the embodiments of the present invention have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim are still deemed to fall within the scope of that claim.

What is claimed is:

1. An amplifier comprising:
a first vacuum tube triode;
a second vacuum tube triode; and
a user configurable switching component that can be positioned into at least a first position and a second position to modify an arrangement of the first vacuum tube triode and the second vacuum tube triode to provide varying tonal characteristics of the amplifier, the first position arranging the first vacuum tube triode and the second vacuum tube triode in a cascode configuration to achieve a tonal characteristic of a vacuum tube pentode, and the second position arranging the first vacuum tube triode and the second vacuum tube triode in a parallel configuration to achieve a tonal characteristic of two vacuum tube triodes operating in parallel.

2. The amplifier of claim 1, wherein positioning the user configurable switching component into the first position couples a plate element of the first vacuum tube triode to a cathode of the second vacuum tube triode.

3. The amplifier of claim 2, wherein signal voltage of the first vacuum tube triode modulates a current flowing to the second vacuum tube triode via a connection between the plate element of the first vacuum tube triode and the cathode of the second vacuum tube triode.

4. The amplifier of claim 3, wherein the signal voltage of the first vacuum tube triode modulates the current flowing to the second vacuum tube triode to cause an increase in gain.

5. The amplifier of claim 2, wherein positioning the user configurable switching component into the second position decouples the plate element from the first vacuum tube triode and the cathode of the second vacuum tube triode.

6. The amplifier of claim 5, wherein positioning the user configurable switching component into the second position couples the plate element of the first vacuum tube triode to a plate element of the second vacuum tube triode.

7. The amplifier of claim 1, wherein the user configurable switching component is a foot switch.

8. The amplifier of claim 1, wherein the first vacuum tube triode and the second vacuum tube triode are encompassed within a single 12AX7 vacuum tube.

9. The amplifier of claim 1, wherein the first vacuum tube triode and the second vacuum tube triode are encompassed within two separate vacuum tubes.

10. The amplifier of claim 9, further comprising:
a preamp including the first vacuum tube triode and the second vacuum tube triode, the preamp configured to receive an input signal and pass the input signal through the arrangement of the first vacuum tube triode and the second vacuum tube triode to generate an output signal;
a power amp configured to amplify the output signal generated by the preamp, resulting in an amplified output signal; and
a speaker configured to output audio sound based on the amplified output signal from the power amp.

11. An amplifier comprising:
a first vacuum tube triode;
a second vacuum tube triode; and
a user configurable switching component that can be positioned into at least a first position and a second position to modify an arrangement of the first vacuum tube triode and the second vacuum tube triode to provide varying tonal characteristics of the amplifier, the first position arranging the first vacuum tube triode and the second vacuum tube triode in a cascode configuration to achieve a tonal characteristic of a vacuum tube pentode, and the second position arranging the first vacuum tube triode and the second vacuum tube triode in a single vacuum tube triode configuration to achieve a tonal characteristic of a single vacuum tube triode operating alone.

12. The amplifier of claim 11, wherein positioning the user configurable switching component into the first position couples a plate element of the first vacuum tube triode to a cathode of the second vacuum tube triode.

13. The amplifier of claim 12, wherein signal voltage of the first vacuum tube triode modulates a current flowing to the second vacuum tube triode via a connection between the plate element of the first vacuum tube triode and the cathode of the second vacuum tube triode.

14. The amplifier of claim 13, wherein the signal voltage of the first vacuum tube triode modulates the current flowing to the second vacuum tube triode to cause an increase in gain.

15. The amplifier of claim 12, wherein positioning the user configurable switching component into the second position decouples the plate element of the first vacuum tube triode from the cathode of the second vacuum tube triode, and couples the plate element of the first vacuum tube triode to a plate load resistor connected to a high voltage terminal.

16. The amplifier of claim 15, wherein positioning the user configurable switching component into the second position results in the second vacuum tube triode being unused within a first circuit that includes the first vacuum tube triode, and the second vacuum tube triode being used within a second circuit that does not include the first vacuum tube triode.

17. The amplifier of claim 11, wherein the user configurable switching component is a foot switch.

18. The amplifier of claim 11, wherein the first vacuum tube triode and the second vacuum tube triode are encompassed within a single 12AX7 vacuum tube.

19. An amplifier comprising:
a first vacuum tube triode and a second vacuum tube triode implemented within an electronic circuit; and
at least one electronic switch implemented within the electronic circuit that can be switched between a first state and a second state to modify an arrangement of the first vacuum tube triode and the second vacuum tube triode to provide varying tonal characteristics of the amplifier, the first state arranging the first vacuum tube triode and the second vacuum tube triode in a cascode configuration to achieve a tonal characteristic of a vacuum tube pentode, and the second state arranging the first vacuum tube triode and the second vacuum tube triode in either a parallel configuration to achieve a tonal characteristic of two vacuum tube triodes operating in parallel or a single vacuum tube triode configuration to achieve a tonal characteristic of a single vacuum tube triode operating alone.

20. The amplifier of claim 1, further comprising:
a user configurable switching component that can be positioned into at least a first position and a second position to modify the state of the at least one electronic switch, a first position of the user configurable switching component causing the first state of the at least one electronic switch and the second position of the user configurable switching component causing the second state of the at least one electronic switch.

\* \* \* \* \*